United States Patent [19]

Belloc et al.

[11] Patent Number: 5,111,417
[45] Date of Patent: May 5, 1992

[54] DIGITAL FILTER SAMPLING RATE CONVERSION METHOD AND DEVICE

[75] Inventors: Jacques Belloc, Antibes; Claude Galand, Cagnes sur Mer; Emmanuel Lancon, Nice; Andre Milewski, Saint Paul; Michel Quintin, La Gaude, all of France

[73] Assignee: International Business Machines Corp., Armonk, N.Y.

[21] Appl. No.: 559,533

[22] Filed: Jul. 19, 1990

Related U.S. Application Data

[63] Continuation of Ser. No. 398,358, Aug. 24, 1989, abandoned.

[30] Foreign Application Priority Data

Aug. 30, 1988 [EP] European Pat. Off. ......... 88480021.0

[51] Int. Cl.$^5$ .............................................. G06F 15/31
[52] U.S. Cl. ............................... 364/724.1; 364/724.16
[58] Field of Search ............. 364/724.01, 724.1, 724.16

[56] References Cited

U.S. PATENT DOCUMENTS

| 4,584,659 | 4/1986 | Stikvoort | 364/724.1 |
| 4,604,720 | 8/1986 | Stikvoort | 364/724 |
| 4,725,972 | 2/1988 | Göckler | 364/724 |
| 4,748,578 | 5/1988 | Lagadec et al. | 364/724 |

FOREIGN PATENT DOCUMENTS

| 273100 | 7/1988 | European Pat. Off. | 364/724.01 |
| 61-100015 | 5/1986 | Japan | 364/724.1 |
| 2180114 | 3/1987 | United Kingdom | 364/724.1 |

OTHER PUBLICATIONS

Croisier et al, "The digital Echo Modulation", IEEE Trans. Communication Technology, COM-18, pp. 367–376 (1970).

Goddard et al, "A 2400-Bits/s Microprocessor-Based Modem", IBM Journal of Research and Development, vol. 25, No. 1, Jan. 1981, pp. 17–24.

*Primary Examiner*—Tan V. Mai
*Attorney, Agent, or Firm*—Edward H. Duffield

[57] ABSTRACT

A digital filter providing output samples at a rate B while input samples are being provided at a rate A. The filter impulse response h(t) is sampled at a rate P=a.A=b.B, with P being the lowest common multiple to A and B, to derive Np filter coefficients therefrom. The coefficients are arranged into "a" sets of Np/a coefficients and stored. Output samples are then computed by feeding input samples Sn at incoming rate while permutating the sets of coefficients and generating output samples at the output rate.

6 Claims, 2 Drawing Sheets

COEFFICIENT SET NUMBER i, i=0,1,..20

```
                            ┌─────────────────────────────────────────┐
                            │           MEMORY       •                │
                            └─────────────────────────────────────────┘
SET SPACING
  =4T/21

COEF.SPACING    ┌────────────────────────────────────────────┐
   =T/21        │ Ci  Ci+21  Ci+42  Ci+63  Ci+84  ....  Ci+231│
                └────────────────────────────────────────────┘
                  x    x      x     ....                  x
                ┌────────────────────────────────────────────┐
INPUT  ────────▶│ Sn  Sn-1  Sn-2              ....    Sn-11  │
                └────────────────────────────────────────────┘
                         │
                         ▼
                       SUM
                         │
                         ▼
                      OUTPUT
                    X=SUM S.C
```

DIGITAL FILTER SAMPLING RATE CONVERSION METHOD AND DEVICE

This application is a continuation of application Ser. No. 07/298,358, filed Aug. 24, 1989, now abandoned.

FIELD OF INVENTION

This invention deals with digital signal processing generally; more particularly, it deals with a method and device for digitally converting a signal sampling rate from one given rate to another given rate.

BACKGROUND OF THE INVENTION

Conventional digital signal processing is achieved by sampling a signal, converting said samples into digital values and then performing mathematical operations over said digital values to achieve the desired processing.

In many applications, one has to switch from one sampling rate to another in the course of the process. Assuming the rates are multiples to one another, up sampling may be achieved by interpolating in between consecutive samples, while down sampling would simply require regularly dropping samples. This process does not directly apply to systems wherein sampling rates ratio would not be an integer value or in other words sampling rates relatively prime.

A fairly straightforward solution would be achieved by converting the sampled signal back to analog form and resampling it at proper rate. However, this solution would not only lack efficiency from a processing load standpoint, it might add to the coding error.

An improved method is disclosed in U.S. Pat. No. 4,460,890 wherein direct digital to digital conversion from a first sampling rate to a second sampling rate, not multiple to each other, is achieved using a rate multiplication means feeding an interpolating means.

This solution is still considered rather complex and not cost optimized.

OBJECTS OF INVENTION

One object of this invention is to provide an improved means for converting a sampled signal from one sampling rate to another within one single process.

Another object is to provide a digital filter fed with input samples at a first rate and providing output samples at a second rate, by computing said output samples through permutations of filter coefficient sets in a predetermined order.

BRIEF SUMMARY OF THE INVENTION

A much improved solution to this rate conversion is proposed here, which, instead of focusing on the samples, focuses on the system transfer function. It combines both filtering and interpolation operations into one single operation, i.e. multi rate filtering or interpolating filtering. To that end, the filter impulse response h(t) is sampled at a rate higher than it should normally be; rate multiple of the symbols rate (A=2742.85) and the D/A converter clock rate (B=14,000). The optimal solution is provided by selecting said multiple to be equal to their lowest common multiple, i.e. P=57.6 kHz

BRIEF DESCRIPTION OF THE DRAWINGS

Further objects, characteristics and advantages of the present invention will be explained in more detail in the following description with reference to the enclosed drawings which represent a preferred embodiment thereof.

DESCRIPTION OF PREFERRED EMBODIMENT

Figure 1:
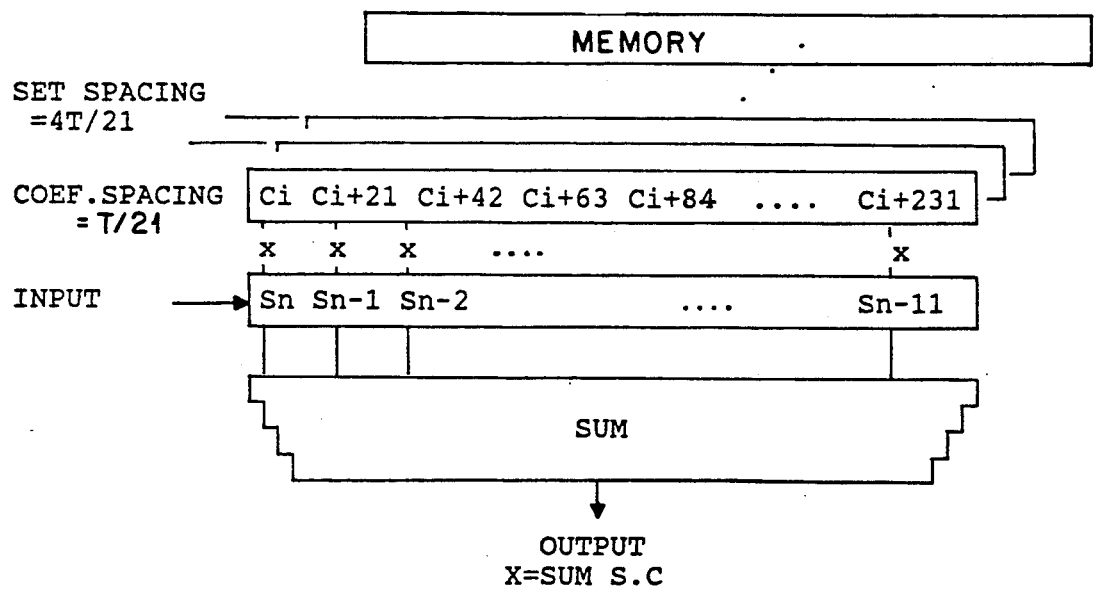
FIGS. 1 and 3 are block diagrams of filters made according to the invention.

Even though the invention applies to any digital system wherein conversion is to be achieved between input and output sampling rates, the detailed description is given herein with reference to QAM-based digital modems and more particularly to digital filtering used within said modems. For details on said modems, one may refer to:

A. Croisier and J. M. Pierret, "The Digital Echo Modulation", IEEE trans. Communication Technology, COM-18, pp 367-376 (1970).

D. Godard and D. Pilost, "A 2400-Bits/s Microprocessor-Based Modem", IBM journal of Research and Development, Vol. 25, No.1, January 1981, pp 17-24.

More particularly, assume a 19.2 Kbits/s modem is to operate at a symbol rate (baud rate) of 2742.85 symbols/s for transmitting and receiving 7 bits per symbol.

Each symbol is selected within an (X,Y) represented constellation, and therefore is defined by two cartesian components, an and bn. Conventional QAM modulation operations involve carrier modulating (=rotating) the symbol, then convolving (filtering) each selected and modulated symbol by a so called signal element impulse response. Said filter is a complex filter, but one may show that the system is fully defined by the real component r(t).

For a modem operating at the 2472.85 symbols/s rate and assuming the filter impulse response is defined by six samples (coefficients) per baud time, then the filter clock should have a rate of 6×2742.85=16457.1 Hz.

According to the conventional modem practice, the filter output is converted into analog form in a D/A converter and then filtered in a low cost, analog, low-pass filter prior to being fed to the transmission line. Naturally, the D/A clock should be rated at 16457.1 Hz.

But assuming one wishes to use a D/A converter clocked at 14400 Hz, the filter output signal S(t) would need resampling properly. Since 14400 and 16457 Hz or 2742.85 Hz are not multiples of each other, the sampling rate conversion operation cannot be achieved in a straightforward manner.

One may interpolate input samples to achieve the rate conversion. But not only does this solution mean additional computing load which might affect the modem signal processor efficiency, it also affects the process precision by adding interpolation noise.

A much improved solution to this rate conversion is proposed here, which, instead of focusing on the samples, focuses on the system transfer function. It combines both filtering and interpolation operations into one single operation, i.e. multi rate filtering or interpolating filtering. To that end, the filter impulse response h(t) is sampled at a rate higher than it should normally be; rate multiple of the symbols rate (A=2742.85) and the D/A converter clock rate (B=14 400). The optimal solution is provided by selecting said multiple to be equal to their lowest common multiple, i.e. P=57.6 kHz since:

$P = a \times A = b \times B$ when a and b are integer values $$57.6 = 21 \times 2.74285 = 4 \times 14.4$$

(NB=throughout this text, the symbol "." is used to designate a multiplication when no ambiguity may occur with decimals, but where decimals are used, the multiplication symbol will be "x").

For an unchanged filter impulse response length (e.g. 12 symbol intervals long), the total number Np of filter coefficients would be:

$$Np = 12 \times \frac{P}{A} = \frac{12 \times 57.6}{2.74885} = 252 \text{ coefficients}$$

Said 252 coefficients are arranged into a 21 sets, herein referenced Set(j) j=0 to 20 of 12 coefficients each.

Set (0) = C0, C21, C42, C63, ..., C231

Set (1) = C1, C22, C43, C64, ..., C232

! ! ! ! ! ! !

! ! ! ! ! ! !

! ! ! ! ! ! !

Set (20) = C20, C41, C62, ..., C251

The multi-rate transmit filter is represented in FIG. 1. It includes a 12 symbol cell long shift register or delay line wherein the symbols S(n) are fed at a rate 1/T=2742.85 Hz. At the current time reference n, the delay line contains the samples Sn, Sn-1, Sn-2, ... Sn-11. The symbol cells are provided with taps connected to multipliers (not shown), the second inputs of which are assigned a filter coefficient (i.e. filter impulse response sample, according to digital filtering theory). Said coefficients are spaced by T/21 over the impulse response and divided into 21 sets of 12 coefficients. The spacing between the subsequent sets is 4T/21 and corresponds to the output rate.

Figure 2:
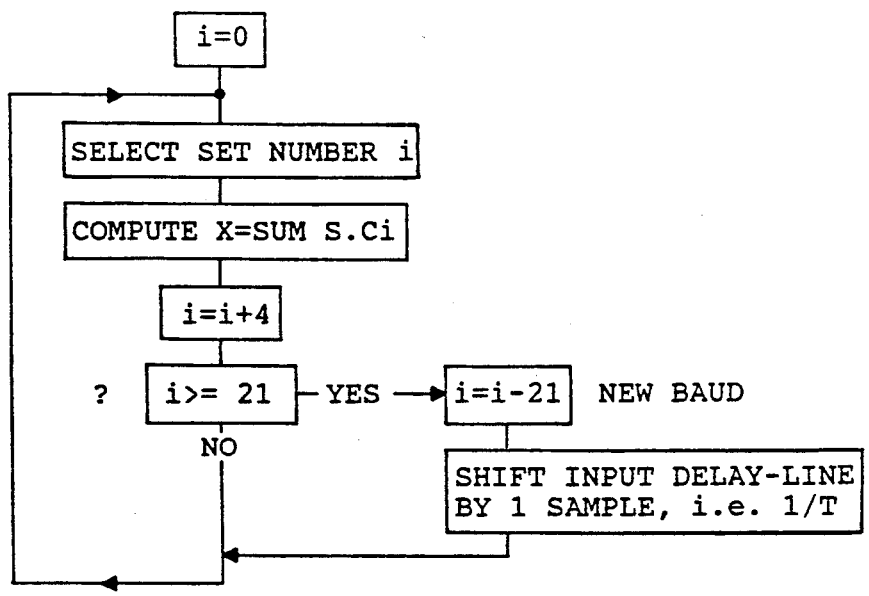
FIG. 2 is a flow chart of the filtering process operated with the device of FIG. 1.

The coefficient sets are used sequentially. They may be stored in a memory and fetched out when needed. The filter output sample X is computed according to the flow diagram of FIG. 2.

More particularly, when the process is started, i=0 and the first set of coefficients, i.e. Set(0) is fetched out of the storage (not shown). The first filtered sample X(n) is computed:

$$X(n) = C0.Sn + C21.Sn - 1 + \ldots + C231.Sn - 11$$

And a new i value is computed: i=i+4=4. Said i value being less than 21, the filter output sample computation is started again.

$$X(n+1) = C4.Sn + C25.Sn - 1 + \ldots + C235.Sn - 11$$

i is again incremented to:

$$i = i + 4 = 8$$

$$X(n+2) = C8.Sn + C29.Sn - 1 + \ldots + C239.Sn - 11$$

$$i = i + 4 = 12$$

$$X(n+3) = C12.Sn + C33.Sn - 1 + \ldots + C243.Sn - 11$$

$$i = i + 4 = 16$$

$$X(n+4) = C16.Sn + C37.Sn - 1 + \ldots + C247.Sn - 11$$

$$i = i + 4 = 20$$

$$X(n+5) = C20.Sn + C41.Sn - 1 + \ldots + C251.Sn - 11$$

i=i+4=24 being larger than 21, i is set to i−21=24−21=3, a new baud time occurred, and a new filter input signal sample Sn+1 is fed into the filter delay line. The new filter output sample X(n+6) is computed:

$$X(n+6) = C3.Sn + 1 + C24.Sn + \ldots + C234.Sn - 10$$

$$i = i + 4 = 7$$

$$X(n+7) = C7.Sn + 1 + C28.Sn + \ldots + C238.Sn - 10$$

$$i = i + 4 = 11$$

$$X(n+11) = C11.Sn + 1 + C32.Sn + \ldots + C242.Sn - 10$$

$$i = i + 4 = 15$$

$$X(n+15) = C15.Sn + 1 + C36.Sn + \ldots + C246.Sn - 10$$

$$i = i + 4 = 19$$

$$X(n+19) = C19.Sn + 1 + C40.Sn + \ldots + C250.Sn - 10$$

$$i = i + 4 = 23 > 21$$

$$i = i - 21 = 23 - 21 = 2$$

a new sample Xn+21 is computed.

$$X(n+21) = C2.Sn + 2 + C23.Sn + 1 + \ldots + C233.Sn - 9$$

and so on.

The system keeps going on with switching among the filter sets of coefficients at 14 400 Hz rate (=21/4 T with 1/T=2742.85 Hz while keeping the filter input rate equal to the baud rate of 1/T 2742.85 Hz. In other words, the rate conversion to be achieved, is combined with filtering operation by judiciously rotating the sets of filter coefficients at 14 400 Hz rate to compute a=21 filter output samples every b=4 input samples. As may be seen from above, this implies 6+5+5+5=21 output samples every 4 input samples.

Therefore, the filter sets of coefficients are repetitively permutated in an order defined by:

$$i \leftarrow (i + b) \text{ modulo } a$$

meaning setting the next i value to (previous i+b) modulo "a" with i being initially set to the index of the first set of coefficients, i.e. i=0. This may be expressed by stating that:

$$i_{old} + b = a \cdot k + i_{new}$$

i being the previous coefficient set index, the above operation provides the number of shifts "k" to be applied to the shift register contents and the new set index (inew) for computing the new output sample.

Thanks to this method, the filter input samples are fed into the filter shift register (delay line) at their own incoming rate, while the output samples are computed by switching the filter coefficient sets at the required output rate.

As mentioned, according to digital filtering theory, the filter coefficients are obtained by sampling the desired filter impulse response. The 252 coefficients may be computed accordingly by sampling the original impulse response at the rate of P 57600 Hz. A slightly less precise result may be achieved by performing interpolation operations over the coefficients of a filter originally designed to operate at rate 16457, i.e. coefficients deriving from a filter impulse response sampled at rate 6/T.

The rationale of this invention may be extended to apply to the modem receiver filter. The input samples derived from the received signal are fed into a receive (Hilbert) filter delay line at the rate of 21 samples per 4T which corresponds to a sampling frequency of 14400 Hz. The receive filter issues two complex symbols per time T (or 8 per 4T) which are then fed into a T/2-spaced equalizer delay line. The filter impulse response is sampled at a rate corresponding to the lowest common multiple of twice the symbol rate (2/T) and the A/D sampling frequency.

$$Ft = K1.(2/T) = K2.(21/4T)$$

with K1 and K2 being the lowest integer values verifying the above equation.

$$Ft = 21.(2/T) = 8.(21/4T) = 42/T = 115,200 \ Hz$$

Assuming the original impulse response was sampled to provide 54 coefficients over T/6 second, then, the number of coefficients for the multirate receive filter for the same length would be $$54.(T/6).(42/T) = 378 \ coefficients$$

These coefficients are divided into 8 sets of coefficients corresponding to the 8 symbols generated per 4T. The number of coefficients is reduced to 376 coefficients or 8 sets of 47 coefficients, namely:

| Set | | | | | | |
|---|---|---|---|---|---|---|
| Set (0) | C0 | C8 | C16 | C24 | C32 | C40 |
| | C48 | C56 | C64 | C72 | C80 | C88 |
| | C96 | C104 | C112 | C120 | C128 | C136 |
| | C144 | C152 | C160 | C168 | C176 | C184 |
| | C192 | C200 | C208 | C216 | C224 | C232 |
| | C240 | C248 | C256 | C264 | C272 | C280 |
| | C288 | C296 | C304 | C312 | C320 | C328 |
| | C336 | C344 | C352 | C360 | C368 | |
| Set (1) | C1 | C9 | C17 | C25 | C33 | C41 |
| | C49 | C57 | C65 | C73 | C81 | C89 |
| | C97 | C105 | C113 | C121 | C129 | C137 |
| | C145 | C153 | C161 | C169 | C177 | C185 |
| | C193 | C201 | C209 | C217 | C225 | C233 |
| | C241 | C249 | C257 | C265 | C273 | C281 |
| | C289 | C297 | C305 | C313 | C321 | C329 |
| | C337 | C345 | C353 | C361 | C369 | |
| Set (2) | C2 | C10 | C18 | C26 | C34 | C42 |
| | C50 | C58 | C66 | C74 | C82 | C90 |
| | C98 | C106 | C114 | C122 | C130 | C138 |
| | C146 | C154 | C162 | C170 | C178 | C186 |
| | C194 | C202 | C210 | C218 | C226 | C234 |
| | C242 | C250 | C258 | C266 | C274 | C282 |
| | C290 | C298 | C306 | C314 | C322 | C330 |
| | C338 | C346 | C354 | C362 | C370 | |
| Set (3) | C3 | C11 | C19 | C27 | C35 | C43 |
| | C51 | C59 | C67 | C75 | C83 | C91 |
| | C99 | C107 | C115 | C123 | C131 | C139 |
| | C147 | C155 | C163 | C171 | C179 | C187 |
| | C195 | C203 | C211 | C219 | C227 | C235 |
| | C243 | C251 | C259 | C267 | C275 | C283 |
| | C291 | C299 | C307 | C315 | C323 | C331 |
| | C339 | C347 | C355 | C363 | C371 | |
| Set (4) | C4 | C12 | C20 | C28 | C36 | C44 |
| | C52 | C60 | C68 | C76 | C84 | C92 |
| | C100 | C108 | C116 | C124 | C132 | C140 |
| | C148 | C156 | C164 | C172 | C180 | C188 |
| | C196 | C204 | C212 | C220 | C228 | C236 |
| | C244 | C252 | C260 | C268 | C276 | C284 |
| | C292 | C300 | C308 | C316 | C324 | C332 |
| | C340 | C348 | C356 | C364 | C372 | |
| Set (5) | C5 | C13 | C21 | C29 | C37 | C45 |
| | C53 | C61 | C69 | C77 | C85 | C93 |
| | C101 | C109 | C117 | C125 | C133 | C141 |
| | C149 | C157 | C165 | C173 | C181 | C189 |
| | C197 | C205 | C213 | C221 | C229 | C237 |
| | C245 | C253 | C261 | C269 | C277 | C285 |
| | C293 | C301 | C309 | C317 | C325 | C333 |
| | C341 | C349 | C357 | C365 | C373 | |
| Set (6) | C6 | C14 | C22 | C30 | C38 | C46 |
| | C54 | C62 | C70 | C78 | C86 | C94 |
| | C102 | C110 | C118 | C126 | C134 | C142 |
| | C150 | C158 | C166 | C174 | C182 | C190 |
| | C198 | C206 | C214 | C222 | C230 | C238 |
| | C246 | C254 | C262 | C270 | C278 | C286 |
| | C294 | C302 | C310 | C318 | C326 | C334 |
| | C342 | C350 | C358 | C366 | C374 | |
| Set (7) | C7 | C15 | C23 | C31 | C39 | C47 |
| | C55 | C63 | C71 | C79 | C87 | C95 |
| | C103 | C111 | C119 | C127 | C135 | C143 |
| | C151 | C159 | C167 | C175 | C183 | C191 |
| | C199 | C207 | C215 | C223 | C231 | C239 |
| | C247 | C255 | C263 | C271 | C279 | C287 |
| | C295 | C303 | C311 | C319 | C327 | C335 |
| | C343 | C351 | C359 | C367 | C375 | |

Figure 3:
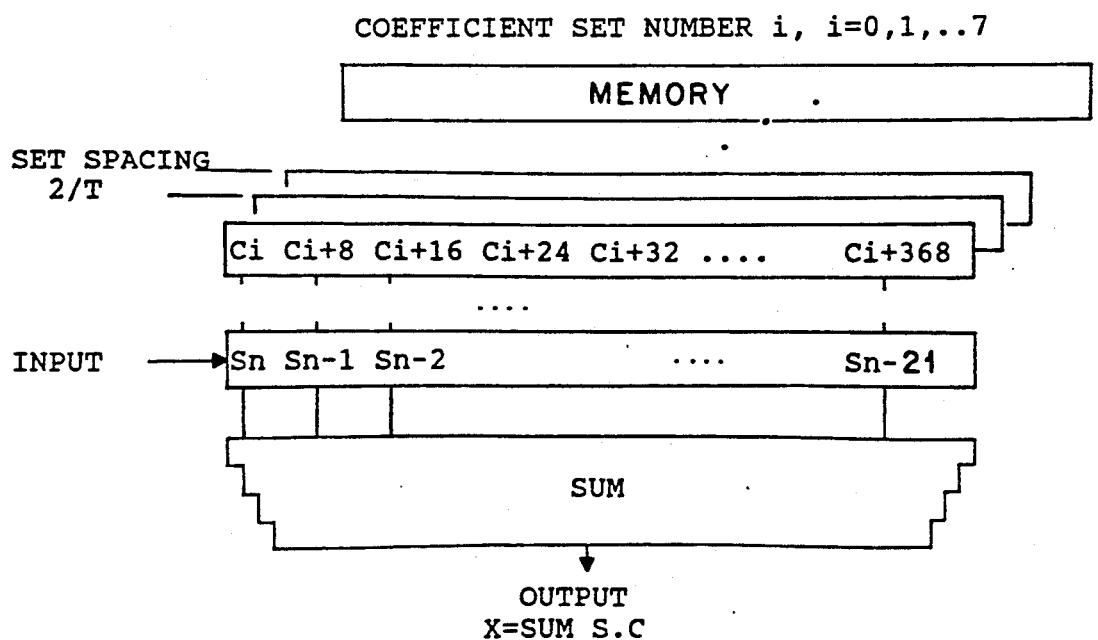

A block diagram representation of the receive filter is shown in FIG. 3. The incoming samples are fed into a 47 samples long delay line. After 4T, the sample Sn has been shifted by 21 positions and is stored into Sn−21. The different sets of 47 coefficients each, numbered Set(0) to Set(7), are stored in a memory (not shown). They are used in a specific order such that:

*New set number = (old set number + 21) modulo 8.*

In addition, before each output sample computation, the delay line contents is shifted by a number of samples given by the quotient of the division of the new index by 8.

*Old set number + 21 = (8.number of shifts) + New set Number*

In other words, assuming the previous set number be i, then $i + 21 = 8k + n$, then, the new set reference number should equal to n and the number of shifts equals to k.

For instance, lets assume the process starts with feeding the Sn input sample into the filter delay line. The output samples are computed and provided as follows:

$$X(0) = Set(0).(Sn, Sn-1, Sn-2, \ldots, Sn-46)$$

$$i + 21 = 21 = 8.2 + 5$$

*New Set number = 5*

*Set(5) is selected.*

Number of shifts=2. Therefore, no output sample is computed when Sn+1 is fed into the filter delay line. Next sample computation X occurs with Sn+2 arrival.

$$X(1) = Set(5).(Sn+2, Sn+1, Sn, \ldots, Sn-44)$$

$$i + 21 = 26 = 3.8 + 2$$

*New Set number=2*

*Set(2) is selected.*

*Number of shifts=3*

$$X(2) = Set(2).(Sn+5, Sn+4, Sn+3, Sn+2 \ldots, Sn-41)$$

$$i + 21 = 23 = 2.8 + 7$$

*New Set to select=S(7)*

*Number of shifts=2*

$$X(3) = Set(7).(Sn+7, Sn+6, \ldots, Sn-39)$$

$$i + 21 = 28 = 3.8 + 4$$

$$X(4) = Set(4).(Sn+10, Sn+9, \ldots, Sn-36)$$

$$i + 21 = 25 = 3.8 + 1$$

$$X(5) = Set(1).(Sn+13, Sn+12, \ldots, Sn-33)$$

$$i + 21 = 22 = 2.8 + 6$$

$$X(6) = Set(6).(Sn+15, Sn+14, \ldots, Sn-31)$$

$$i + 21 = 27 = 3.8 + 3$$

$$X(7) = Set(3).(Sn+18, Sn+17, \ldots, Sn-28)$$

$$i + 21 = 24 = 3.8 + 0$$

The process starts rescanning the coefficients sets, i.e. Set(0), Set(5), Set(2), Set(7), Set(4), Set(1), Set(6), Set(4), etc...

In summary, the algorithm may be expressed by:

$$i_{old} + 21 = 8 \cdot k + i_{new}$$

For twenty one input samples, the filter provides eight output samples using the eight sets of coefficients Set(0) through Set(7) in a fixed order defined by the above equation.

What is claimed is:

1. A digital filter having a predefined impulse response h(t) for filtering an input signal sampled at a rate A into a filtered output signal sampled at a rate B, said filter including a shift register provided with taps, a set of multipliers, each multiplier having one input connected to one of said taps, adding means connected to said multipliers, and storage means for storing filter coefficients to be added to said multiplier inputs, said filter being characterized in that it includes:

means for sampling said filter having a predefined impulse response h(t), said sampling being conducted at a rate substantially equal to the lowest common multiple P of A and B, and deriving therefrom Np filter coefficients;

means for arranging a number N'p of said coefficients, N'p being substantially equal to Np, into sets of coefficients, Set(i);

means for feeding said input signal samples into said shift register at said input rate; and means for fetching sets of filter coefficients in a predetermined order and applying said coefficients to said multipliers at a rate B;

whereby the output samples are being generated at said B rate.

2. A variable rate filtering process for filtering a digital signal S(n) representative of an analog input signal, which has been sampled at an input rate A, into an output signal X(x) representative of the filtered analog output said output signal being sampled at a rate B, said filtering being conducted in accordance with the filter impulse response characteristic h(t) defining the considered filtering function, said process including steps of:

deriving Np filter coefficients C(i), where i is an integer in the range i=0 to Np−1 corresponding to said impulse response function h(t) of said given filter sampled at a rate P where P is a common multiple of A and B equal to "a" times A and to "b" times B, where "a" and "b" are integers, splitting said Np filter coefficients C(i) into "a" sets S(i) where i is an integer value in the range of 0 to 1−;

storing said S(i) coefficient sets;

providing a buffer register means;

buffering in said buffer register means said input digital samples S(n) of said analog signal sampled at rate A;

generating "a" output signal samples while "b" input samples are being fed into the filter, each output sample generation including convoluting said input digital samples, buffered in said buffering step, with a selected coefficient set S(i), i being repetitively permuted in a predefined order while generating consecutive output samples; and, providing said processed output signal samples X(n) as representative of filtered input signal samples S(n) through said filter of given impulse response h(t).

3. A process according to claim 2 wherein A and B are relatively prime.

4. A process according to claim 2 or 3, wherein "a" and "b" are computed for P being the lowest multiple to both A and B.

5. A process according to claim 4 wherein said filter input rate A is higher than output rate B, whereby each output sample computation involves shifting the input samples k positions into a filter having filter impulse response h(t), with k being the quotient of the division of "a" plus previous coefficient set index, by "b".

6. A process according to claim 4, wherein said coefficient set S(i) permutation is obtained by deriving the new set order "i new" from the current set index "i old" using the following relationship: i new=(i old+b) modulo a.

* * * * *